United States Patent [19]
Kim et al.

[11] Patent Number: 5,252,845
[45] Date of Patent: Oct. 12, 1993

[54] TRENCH DRAM CELL WITH VERTICAL TRANSISTOR

[75] Inventors: Cheon S. Kim, Seo; Jin H. Lee, Jung; Kyu H. Lee, Yusong; Dae Y. Kim, Jung, all of Rep. of Korea

[73] Assignee: Electronics and Telecommunications Research Institute, Rep. of Korea

[21] Appl. No.: 880,300

[22] Filed: May 5, 1992

Related U.S. Application Data

[63] Continuation of Ser. No. 678,124, Apr. 1, 1991, abandoned.

[30] Foreign Application Priority Data

Apr. 2, 1990 [KR] Rep. of Korea ............... 4603-1990

[51] Int. Cl.⁵ ............... H01L 29/68; H01L 29/78; H01L 29/92
[52] U.S. Cl. ............... 257/302; 257/304; 257/400
[58] Field of Search ............... 357/23.6 G; 437/52; 257/301, 302, 304, 400

[56] References Cited

U.S. PATENT DOCUMENTS

| | | | |
|---|---|---|---|
| 4,786,954 | 11/1988 | Morie et al. | 357/41 |
| 4,916,524 | 4/1990 | Teng et al. | 357/23.6 G |
| 4,926,224 | 5/1990 | Redwine | 357/55 |
| 5,072,269 | 12/1991 | Hieda | 357/23.6 G |

FOREIGN PATENT DOCUMENTS 1-253956  10/1989  Japan ..................... 437/52

Primary Examiner—William Mintel
Assistant Examiner—Robert Limanek
Attorney, Agent, or Firm—Blakely, Sokoloff, Taylor & Zafman

[57] ABSTRACT

The DRAM cell of the invention comprises a structure wherein a deep trench is formed on a silicon wafer, a stacked trench capacitor is formed around a silicon pillar associated with the trench, and a vertical transfer transistor is formed on top of the silicon pillar after the formation of the stacked trench capacitor. The transfer transistor is connected to the storage capacitor through a selectively doped n+ diffused layer, and isolation between DRAM cells is formed by the trench.

10 Claims, 11 Drawing Sheets

SIDE WALL CONTACT REGION

TRENCH DRAM CELL WITH VERTICAL TRANSISTOR

This is a continuation of application Ser. No. 07/678,124 filed Apr. 1, 1991, now abandoned.

BACKGROUND OF THE INVENTION

The present invention relates to a high density dynamic random access memory ("DRAM") and more specifically to a trench DRAM cell including a vertical transistor, thereby improving reliability and the electrical characteristics of the cell.

In order to form a high density DRAM, technology must be developed for maintaining in a small cell area the same storage capacitance as would be found in a low density DRAM. This could not be achieved by the conventional planar cell for memories with a capacity of 4 MB or more.

Therefore, to achieve a greater capacitance in a smaller cell area, trench capacitor and stacked capacitor technologies have been explored recently. However, most of the cell structures which have been studied so far have not satisfied the density requirements for DRAMs with a memory capacity of 64 MB or more because a transfer transistor is horizontally placed on the substrate and a storage capacitor is placed on the side of the transfer transistor.

To solve the above problem, the Composed Trench Transistor ("CTT") has been designed. As shown in FIG. 1a, the transfer transistor is vertically placed and the storage capacitor is placed under the transfer transistor in the CTT cell. However, in the fabrication step of the CTT cell, an isolation region between adjacent cells cannot be reduced because isolation between bit lines is performed by the Local Oxidation of Silicon ("LOCOS") method.

Further, FIG. 1b shows a cross-sectional view of a cell with a Surrounding Gate Transistor ("SGT") structure, which has been recently developed. In this cell structure, a transfer transistor with a vertical structure is placed on top of a silicon pillar and a high capacitance ("Hi-C") storage capacitor is placed under the silicon pillar. Therefore, isolation between adjacent cells is formed by trench isolation and a transfer transistor and a storage capacitor are all formed in the silicon pillar.

Although this SGT cell satisfied the requirements for a cell to accommodate a 64 MB DRAM, it was not immune to alpha particle-induced soft errors due to the Hi-C structure. Moreover, because the outside of the silicon pillar was highly doped with impurities associated with the high capacitance, the SGT cell had a problem in that the transfer transistor was electrically floating on the substrate due to the depletion region that occurs in the case of a small silicon pillar size (greater than 0.5 $\mu$m)

SUMMARY OF THE INVENTION

Accordingly, an object of the invention is to provide an improved trench DRAM cell including the vertical transistor feature, and the manufacturing method thereof, to produce a DRAM cell having high reliability and stable operating characteristics, allowing the cell to be used in the formation of a DRAM with a capacity that equals or exceeds 64 MB.

Another object of the invention is to provide a trench DRAM cell using Selective Epitaxial Growth ("SEG") technology.

In order to achieve the above objects, the DRAM cell of the invention comprises a structure wherein a deep trench is formed in a silicon wafer, a stacked trench capacitor is formed around a silicon pillar, and a vertical transfer transistor is formed on top of the silicon pillar after the formation of the stacked trench capacitor. Accordingly, the transfer transistor is placed on top of the silicon pillar, the storage capacitor is placed under the silicon pillar, the transfer transistor is connected to the storage capacitor through the selectively doped n diffused layer, and isolation between cells is achieved.

BRIEF DESCRIPTION OF THE DRAWINGS

The invention will be readily understood from the following more detailed description presented in conjunction with the following drawings in which.

DETAILED DESCRIPTION OF THE PREFERRED EMBODIMENTS

FIGS. 2a–h show the process flow of an embodiment of the invention.

Figure 1A:
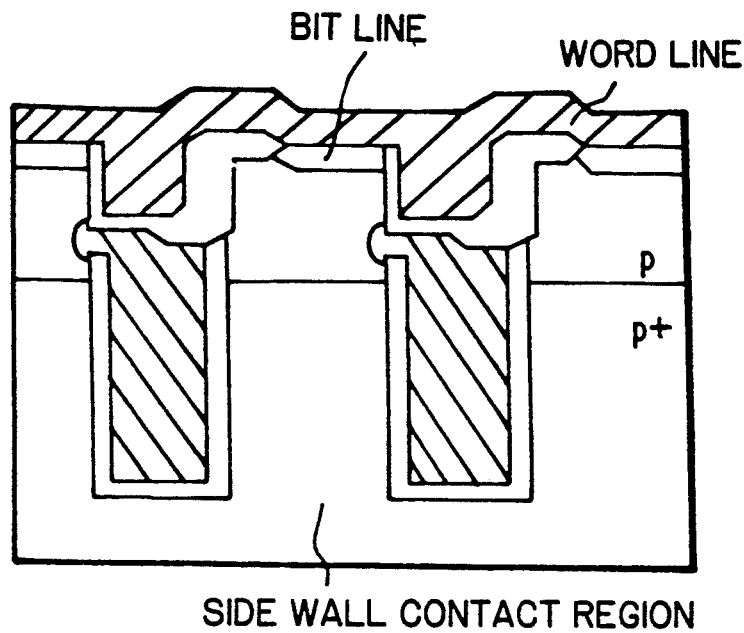
FIG. 1a shows a cross-sectional view of a conventional CTT cell.
Figure 1B:
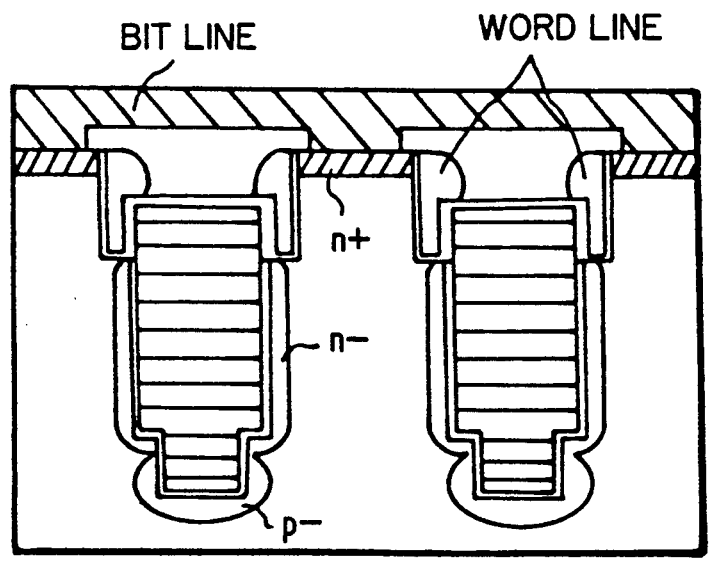
FIG. 1b shows a cross-sectional view of a conventional SGT cell.
Figure 2A:
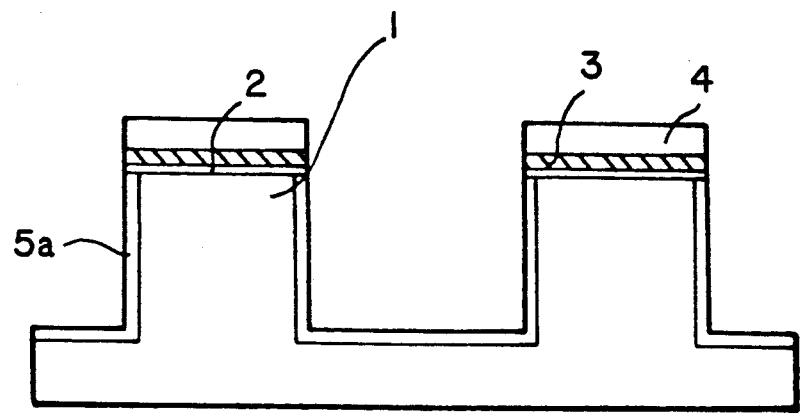
FIGS. 2a–h show a cross-sectional views showing the fabrication process of a preferred embodiment of the invention.

FIG. 2a shows trenches formed on a silicon wafer after oxide layer 2 is formed to a thickness of approximately 250 Å on p-type silicon wafer 1, and silicon nitride layer 3 is deposited to a thickness of approximately 1000 Å on pad oxide layer 2. Thereafter, oxide layer 4 is deposited to a thickness of approximately 3000 Å on silicon nitride layer 3 by the Chemical Vapor Deposition ("CVD") method. The CVD oxide is densified in $H_2/O_2$ ambient at 925° C. and a mask layer is formed for trench etching. Oxide layer 4, silicon nitride layer 3 and oxide layer 2 are sequentially etched by the Reactive Ion Etch ("RIE") method using said trench mask layer. After trenches of 0.3 $\mu$m to 1.2 $\mu$m deep are etched in order to form a transfer transistor, oxide layer 5a is grown in the trenches. See FIG. 2a.

Figure 2B:
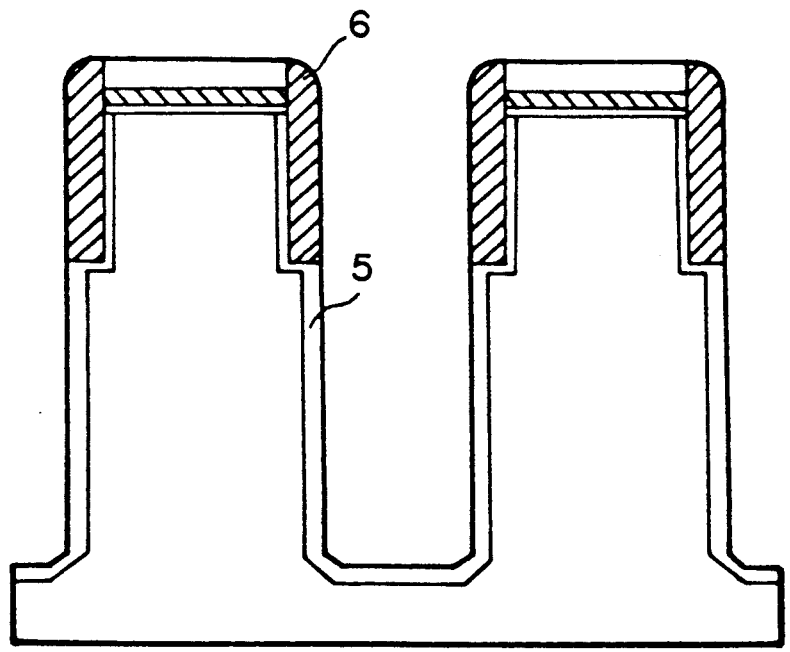
Figure 2C:
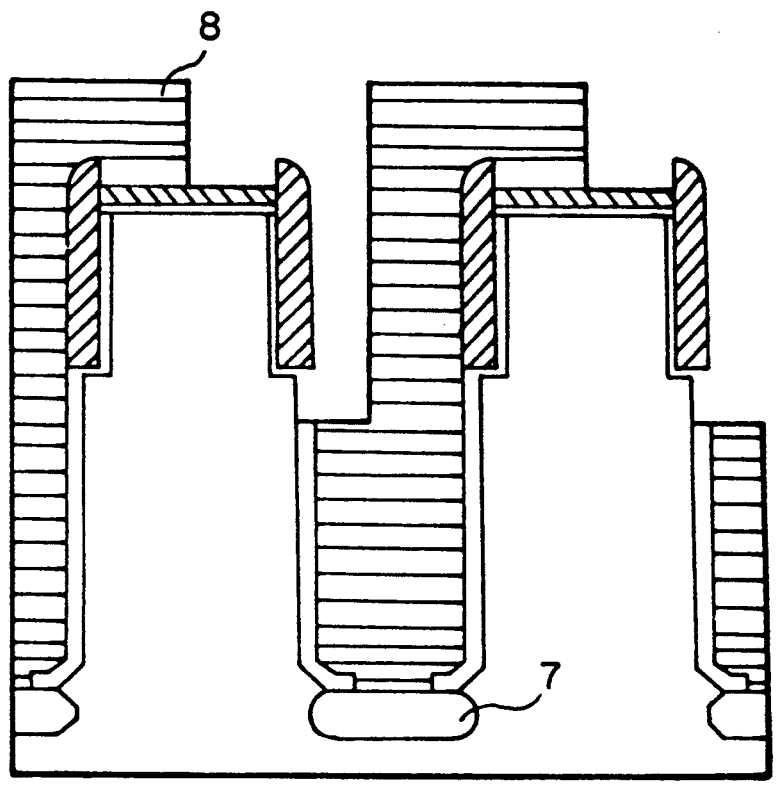
Figure 2D:
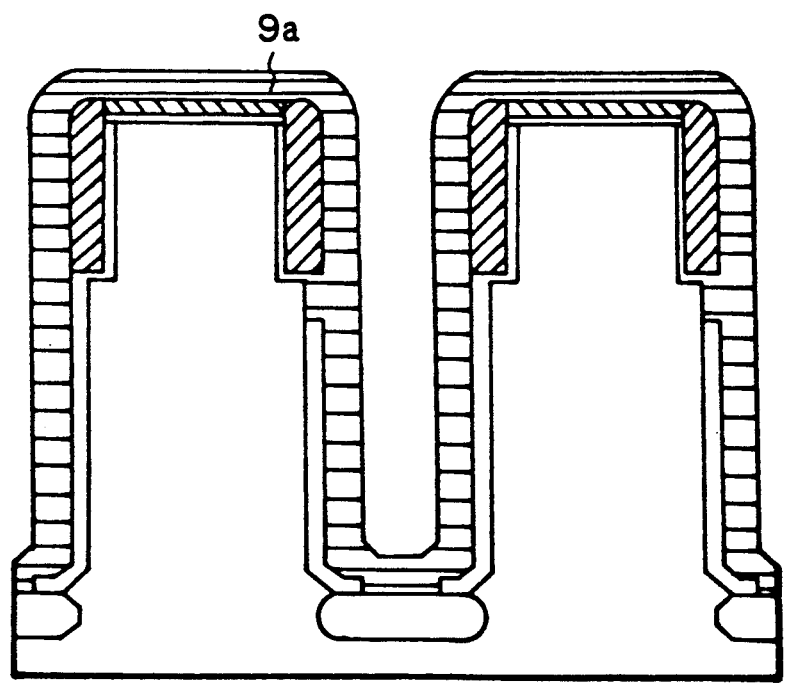
Figure 2E:
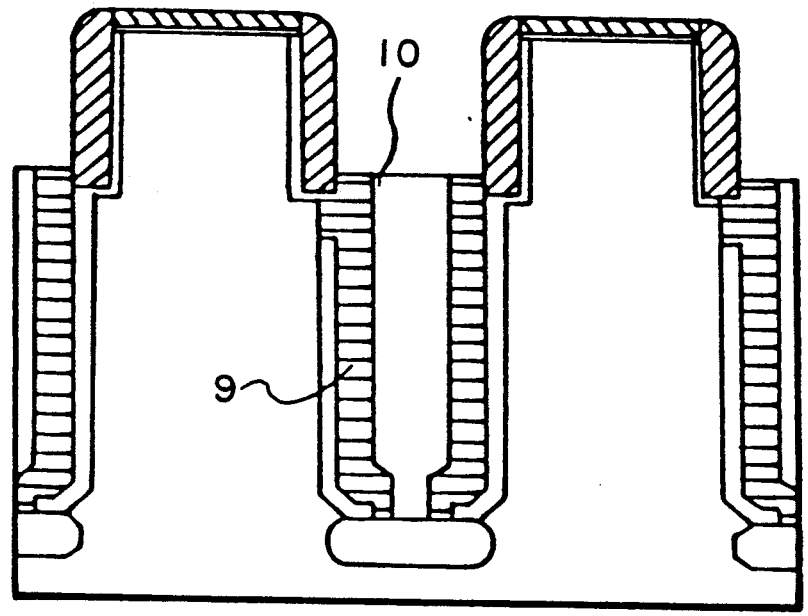

FIG. 2b shows the second set of trenches formed on wafer 1. A silicon nitride layer is deposited and silicon nitride sidewall spacer 6 is formed. After second trenches of 3 $\mu$m to 5 $\mu$m deep are etched, oxide layer 5 is grown with a thickness of 2000 Å in $H_2/O_2$ ambient at 950° C.

The silicon oxide layer in the trench bottom is etched by the RIE method and boron implantation (or BN sourcing) is performed to achieve isolation 7 from adjacent cells. Then thick photoresist 8 is coated, and the silicon oxide layer is locally wet etched to form the side wall opening for the storage node contact with the access transistor. See FIG. 2c.

After polysilicon 9a is deposited and is doped with POCl₃, the photoresist 10 is coated and is etched by an etch back process. By this process, storage node 9 is formed. See FIGS. 2c-e.

Figure 2F:
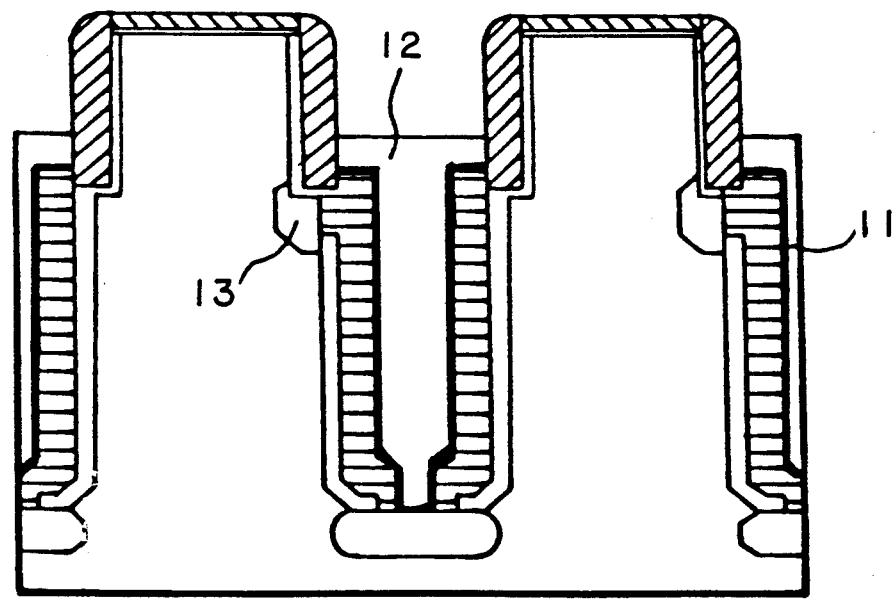

FIG. 2f shows the process of forming capacitor dielectrics. The photoresist 10 in the trench is removed and polysilicon layer 9 in the trench bottom is removed by the RIE method, and capacitor dielectric 11 having an Oxide/Nitride/Oxide ("ONO") structure is formed in the trench to a thickness corresponding to the equivalent thickness of 100 Å SiO₂, had SiO₂ been used instead of ONO. Moreover, n+ diffused layer 13 is diffused in p-type silicon wafer 1 through the opening in side wall oxide 5 during the heating process. This n+ diffusion layer 13 and storage node 9 are connected to the transfer transistor. After polysilicon is deposited to a thickness of about 3,000 Å and is doped with POCl₃, polysilicon is again deposited to a thickness of over 2 μm and is doped with POCl₃. Next polysilicon layer 12, which is a plate of a capacitor, is overetched on the region to form the device by the etch back process. Through these steps, polysilicon layer 12 is isolated from storage node 9 and isolation region 7 at the bottom of the trench by capacitor dielectric 11, thereby isolating plate 12 from the substrate.

Figure 2G:
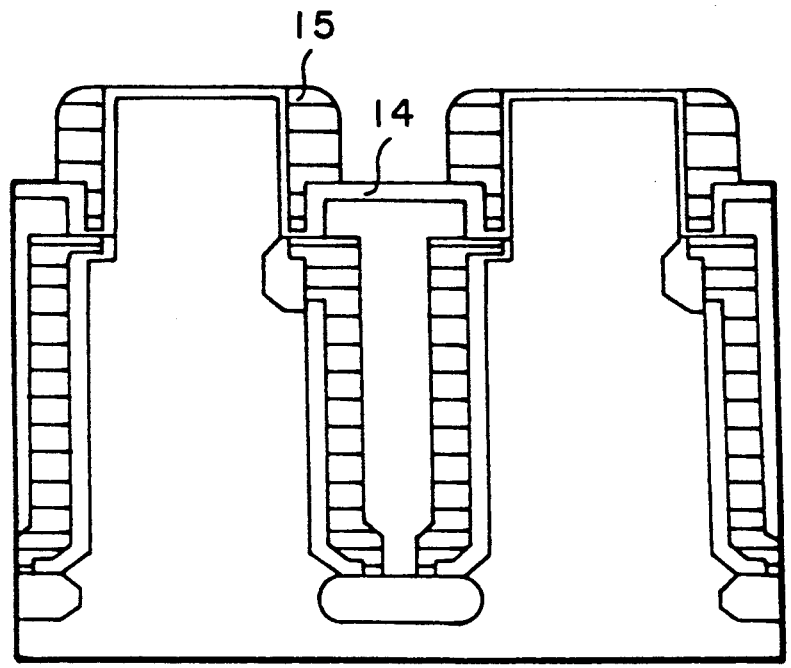

FIG. 2g shows the process of forming a word line. After silicon nitride side wall spacer 6, silicon nitride layer 3 and oxide layer 2 are removed by a wet etching, gate oxide 14 is grown to a thickness of 100-200 Å in O₂ ambient added trichlorethane ("TCA") at 1000° C. Next, polysilicon is deposited to a thickness of 3,000 Å and is doped with POCl₃, and then polysilicon is etched to the above thickness by the RIE method. According to the above process, the word line 15, which is used as a gate electrode, is formed.

To form drain 16, As ions are implanted with a dose of 5E15/cm² at 60 KeV and is annealed for 30 minutes at 950° C.

Next low temperature oxide ("LTO") 18 is deposited to a thickness of about 7,000 Å, and bit line 17 is formed on the LTO.

Figure 2H:
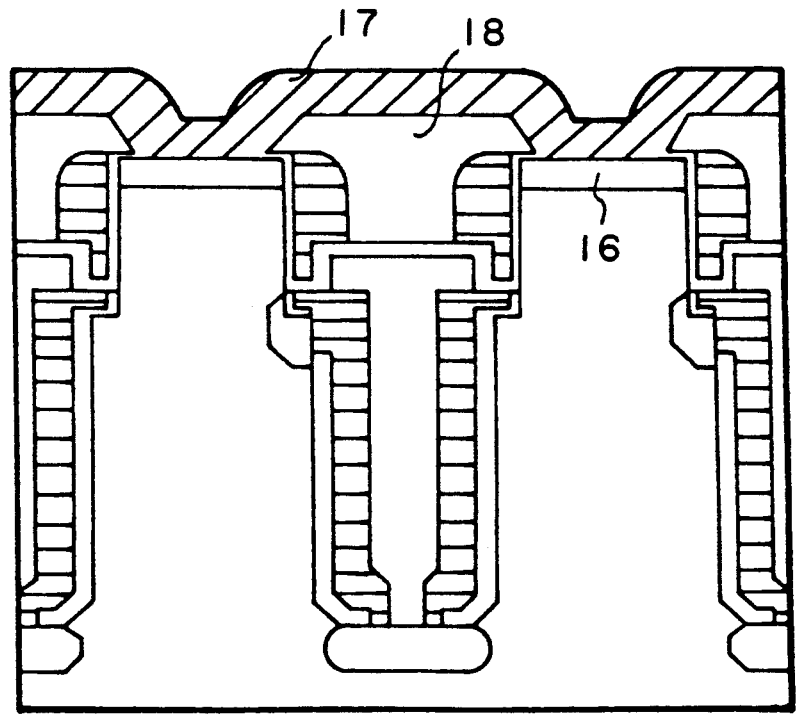

FIG. 2h shows a cross-sectional view of the DRAM cell formed in accordance with the above process.

Figure 3:
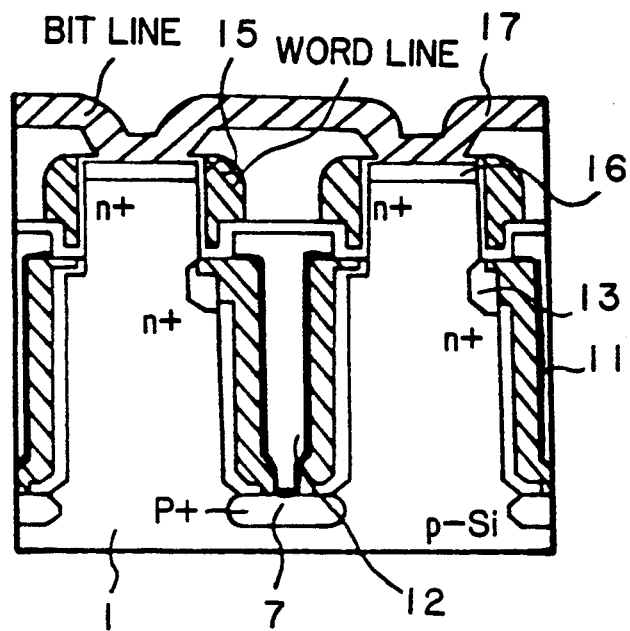
FIG. 3 shows a cross-sectional view of a trench DRAM cell of a preferred embodiment of the invention.

FIG. 3 shows a cross-sectional view of the trench DRAM cell of an embodiment of the invention.

Figure 4:
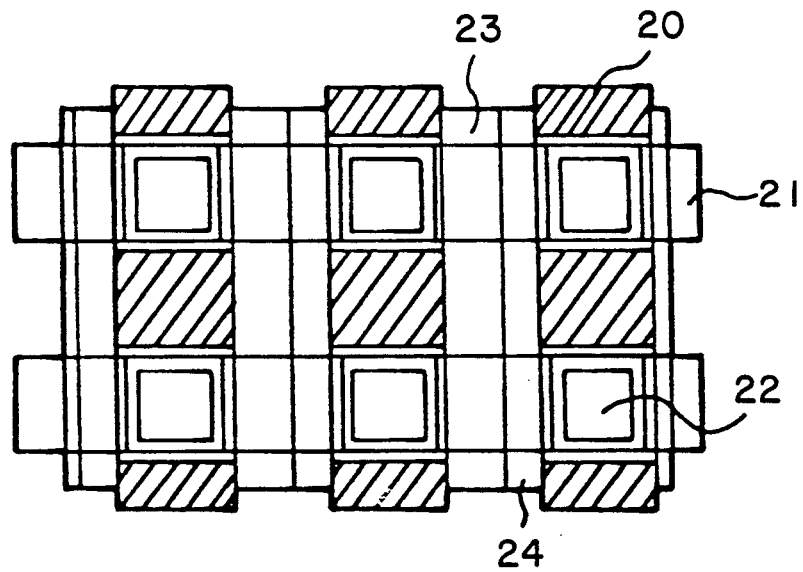
FIG. 4 shows a lay-out pattern of the trench DRAM cell of a preferred embodiment of the invention.

FIG. 4 shows a lay-out pattern of the trench DRAM cell of an embodiment of the invention.

Another embodiment of the invention is the trench DRAM cell using SEG technology.

FIG. 5 shows the process flow of another embodiment of the invention.

Figure 5A:
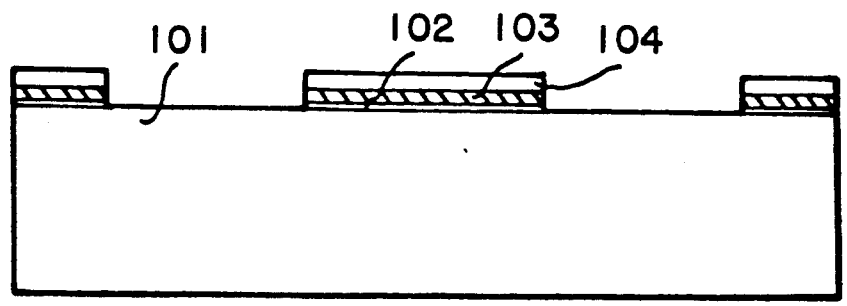
FIGS. 5a–j show cross-sectional views showing the fabrication process of another embodiment of the invention using SEG technology.

As shown in FIG. 5a, after oxide layer 102 is formed to a thickness of about 250 Å on p-type silicon wafer 101 and silicon nitride layer 103 is deposited to a thickness of about 1,000 Å on said oxide layer 102, oxide layer 104 is deposited to a thickness of about 800 Å on said silicon nitride layer 103 by the CVD method. The CVD oxide is densified in H₂/O₂ ambient for 30 minutes at about 925° C. and the mask layer is formed for trench etching. Oxide layer 104, silicon nitride layer 103 and oxide layer 102 are sequentially etched by the RIE method using said mask layer. Trenches of 5 μm to 10 μm deep are etched.

Figure 5B:
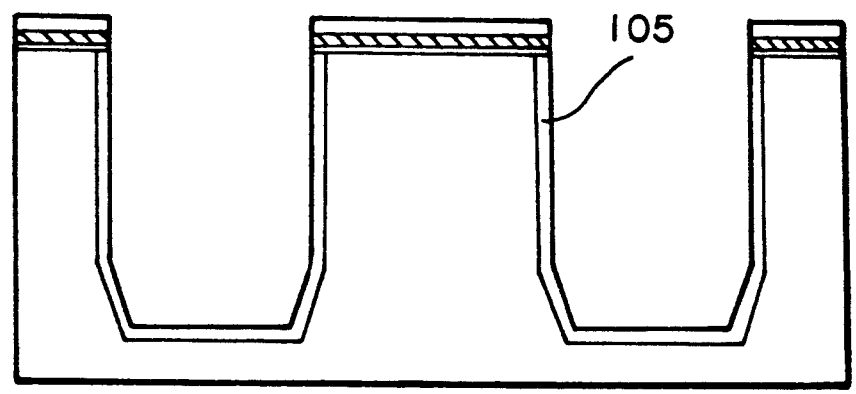
Figure 5C:
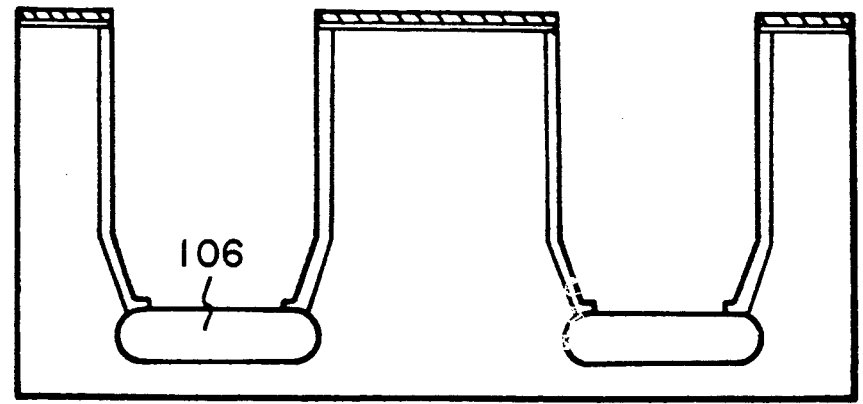

FIG. 5b shows a cross-sectional view of oxide layer 105 having a thickness ranging from 1,000 Å to 2,000 Å grown in H₂/O₂ ambient at about 950° C.

After oxide layer 105 in the bottom of the trench is etched, p+ diffusion layer 106 doped with p+ is formed in order to provide cell-to-cell isolation, wherein p+ doping is carried out by ion implantation with boron or by BN sourcing. See FIG. 5c.

Next, the photoresist is coated and the region connecting the storage node to the transistor is defined by using photoresist 107.

Figure 5D:
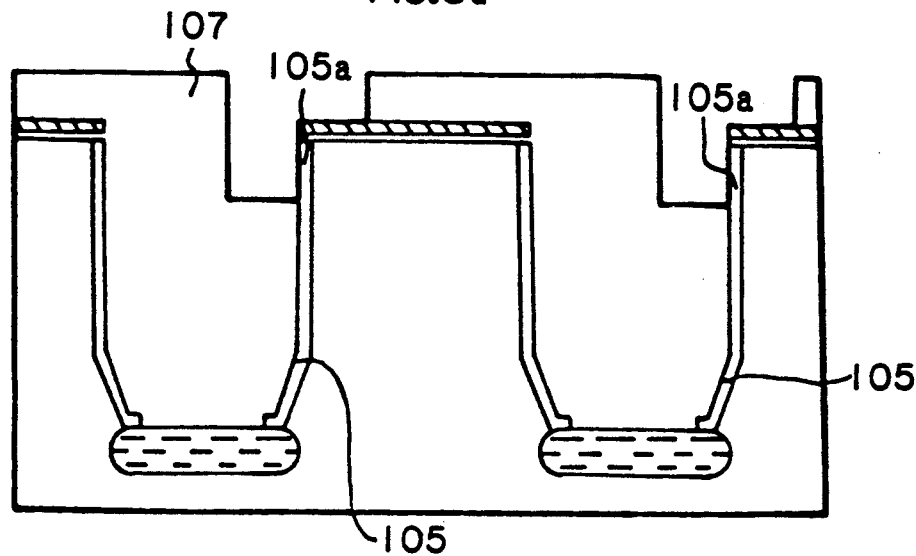
Figure 5E:
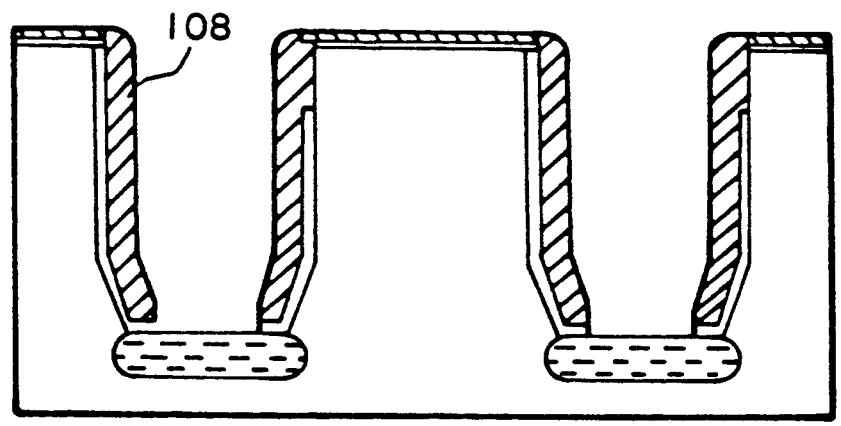

FIG. 5d shows a cross-sectional view showing the selectively defined oxide layer 105a. After oxide layer 105a of the side wall is etched, polysilicon is deposited to a thickness of about 1,000 Å and is doped with POCl₃.

Next, the storage node 108 of the side wall spacer doped with n+ is formed by the RIE method. See FIG. 5e.

Figure 5F:
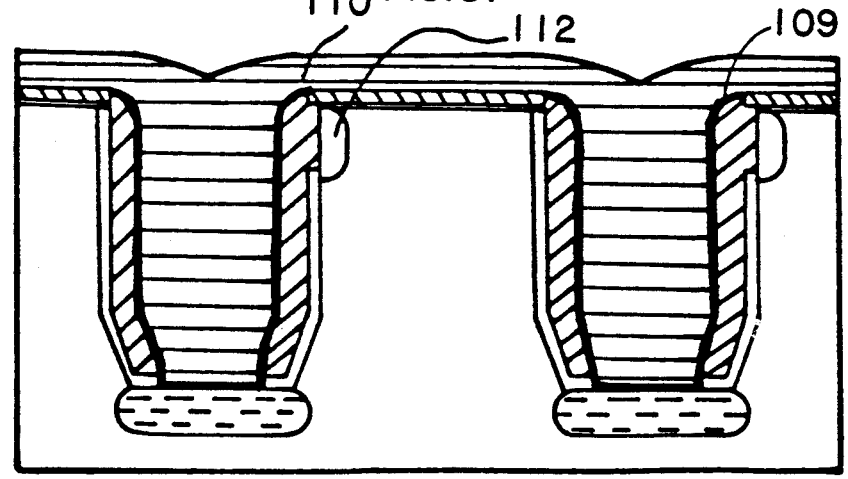

Referring to FIG. 5f, the capacitor dielectric 109 having an O/N/O structure is formed on the surface of the storage node 108 to a thickness corresponding to the equivalent thickness of 100 Å SiO₂.

During the heating process, n+ diffused layer 112 is diffused in p-type silicon wafer 101 through the opening in side wall oxide 105a such that the storage node 108 is connected to the source of the transistor.

Next, polysilicon is deposited to a thickness of about 3,000 Å and is doped with POCl₃.

Again, polysilicon is deposited to a thickness of over 2 μm and is doped with POCl₃.

According to the above process, the trench is filled with polysilicon 110. See FIG. 5f. Through these steps, polysilicon capacitor plate 110 is isolated from storage node 108 and isolation region 106 at the bottom of the trench by capacitor dielectric 109, thereby isolating plate 110 from the substrate.

Figure 5G:
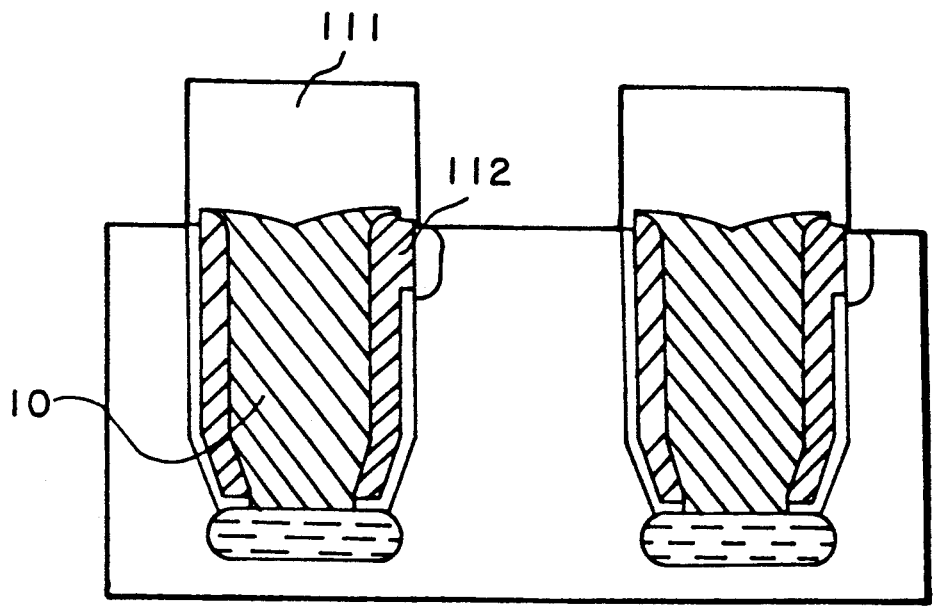

Referring to FIG. 5g, after the trench is filled with polysilicon 110 (which is a plate of a capacitor), the polysilicon is etched until it remains just within the trench, and oxidation of the polysilicon is carried out in H₂/O₂ ambient at about 900° C. such that the resulting oxide thickness is about 200 Å.

Next, CVD oxide layer 111 is deposited to a thickness of 1 μm and the region on which an epitaxial layer is grown is defined and then is etched by the RIE method.

Figure 5H:
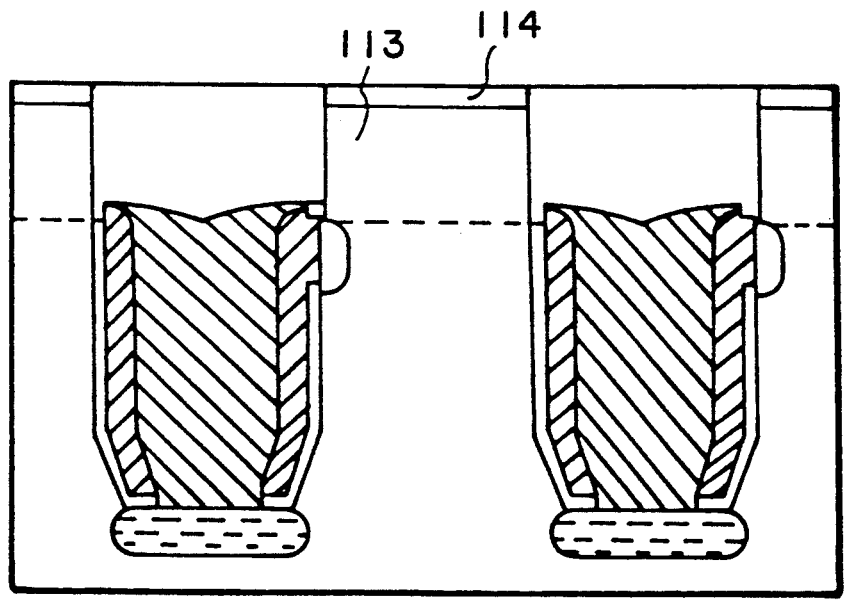

Referring to FIG. 5h, silicon crystal 113 is grown outside of the trench to a thickness of 1 μm by using the SEG technique.

After lapping, As ions are implanted and annealed at about 950° C., forming the drain junction 114 of a vertical transistor.

Figure 5I:
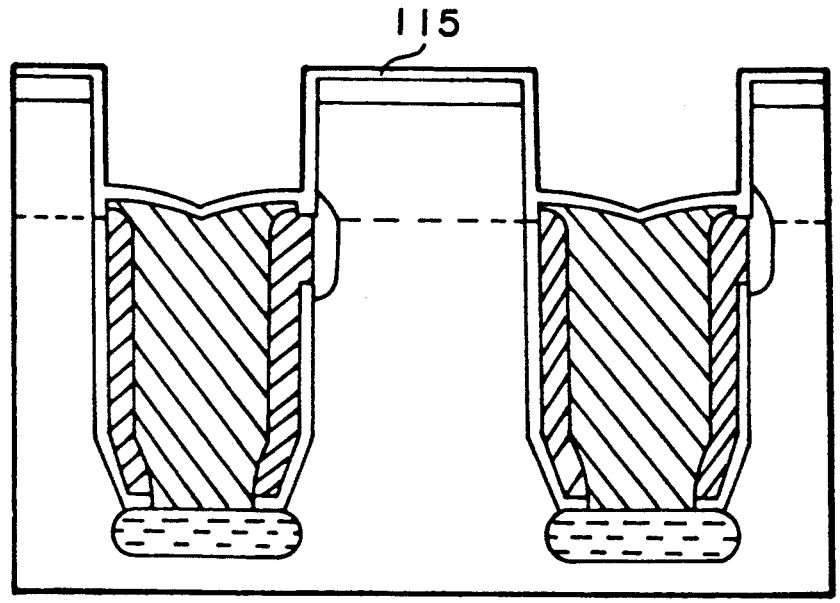
Figure 5J:
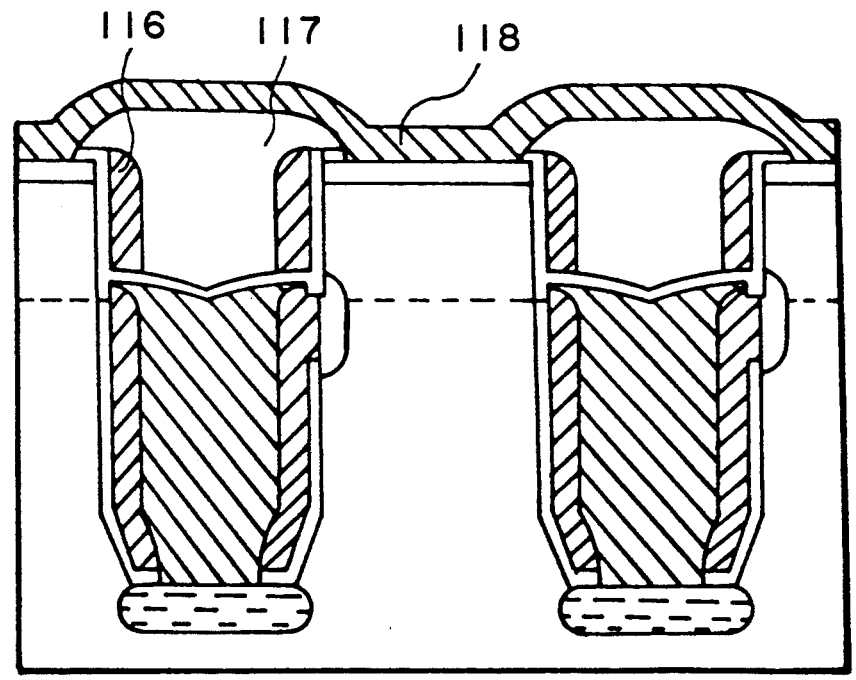

As shown in FIG. 5i, after all the CVD oxide 111 except for silicon crystal 113 is removed by wet etching, gate oxide 115 is grown to a thickness of 100-200 Å in O₂ ambient added TCA at 1,000° C.

Next polysilicon on gate oxide 115 is deposited to a thickness of about 3,000 Å and is doped with POCl₃, and then polysilicon is etched to the above thickness by the RIE method.

According to the above process, word line 116 is formed after LTO 117 is deposited to a thickness of about 7,000 Å, and bit line 118 composed of Al is formed on LTO.

Figure 6:
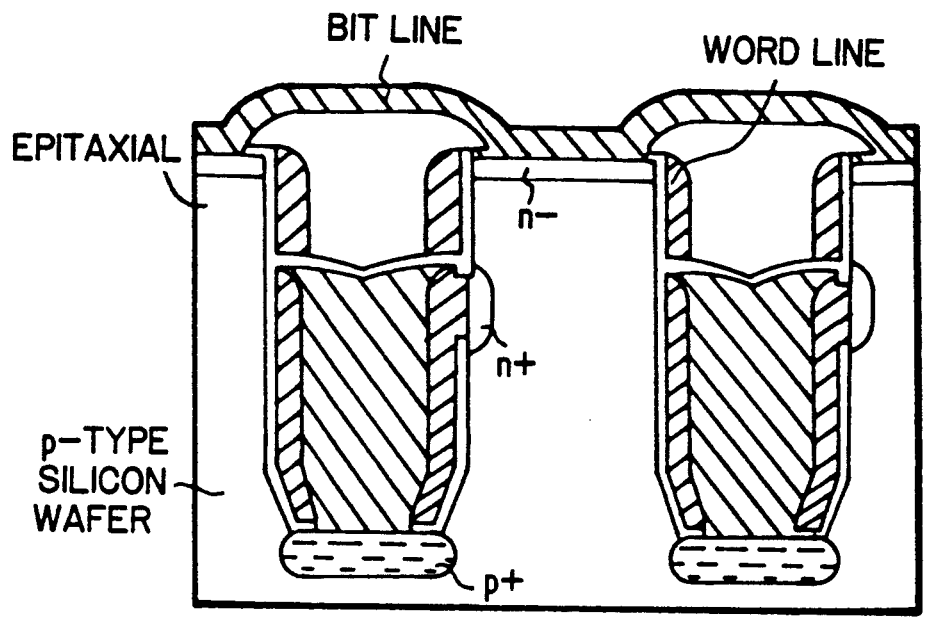
FIG. 6 shows a cross-sectional view of a DRAM of a DRAM cell of another embodiment using SEG technology.

FIG. 6 shows a cross-sectional view of a DRAM cell with a trench structure accomplished in accordance with the above process.

Figure 7:
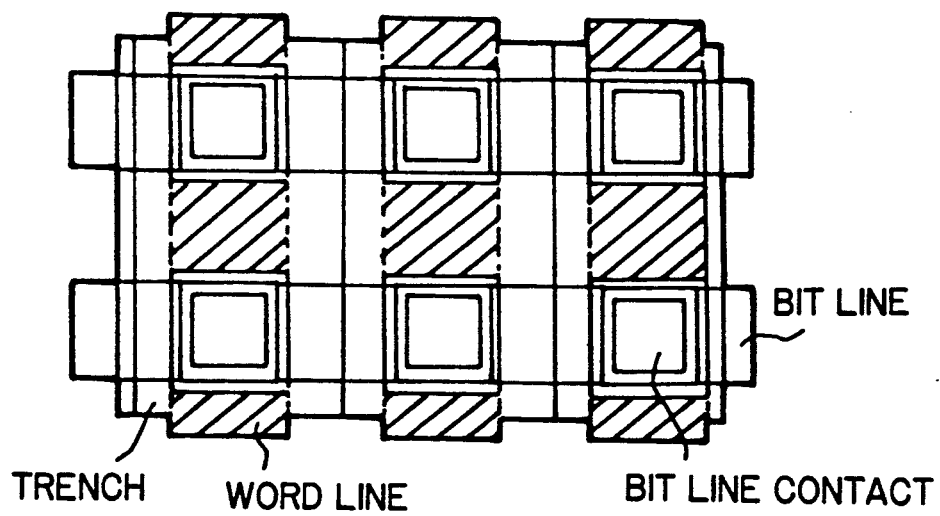
FIG. 7 shows a lay-out pattern of a DRAM cell of another embodiment using SEG technology.

FIG. 7 shows a lay-out pattern of a DRAM cell with a trench structure using SEG technology.

Trench DRAM cells having the vertical transistor as in the invention can reduce the problem of the transistor electrically floating on the substrate. Moreover, reduced SER and high reliability is provided by the stacked trench capacitor.

What is claimed is:

1. A trench DRAM cell with a vertical transistor in a semiconductor device, comprising:

a silicon pillar having an outside four surfaces and a top surface;

a storage capacitor composed of a storage node with a stacked trench structure formed on the outside four surfaces of the silicon pillar in a p-type silicon wafer except for an upside and a bottom of the stacked trench;

a capacitor dielectric formed on the storage node, and a plate formed in the stacked trench and formed on the capacitor dielectric except for an upside of the stacked trench, wherein said plate is isolated from said storage node and the bottom of said trench by said capacitor dielectric, so that said plate is isolated from a substrate of said cell;

an isolation region formed at the bottom of the stacked trench; and a transfer transistor with a vertical structure composed of a source connected to the storage node in a part of the upside of the storage node, a gate oxide formed on the outside four surfaces of the upper part of the silicon pillar, a word line which is a gate electrode, formed on the gate oxide, and a drain formed on the top surface of the silicon pillar in regions between the trenches.

2. A trench DRAM cell with a vertical transistor according to claim 1, wherein said capacitor dielectric is formed from an ONO (Oxide/Nitride/Oxide) substance having a thickness corresponding to an equivalent thickness of 100 Å $SiO_2$.

3. The trench DRAM cell with a vertical transistor according to claim 1, wherein the storage node is isolated from adjacent cells by doping a bottom of the trench with p+ dopant after said trench bottom has been etched.

4. A trench DRAM cell with a vertical transistor according to claim 3, wherein the source comprises an n+ diffused layer diffused with n-type impurities in the storage node through a window removed by an oxide to form an opening in one side of the upside of said storage node.

5. A trench DRAM cell with a vertical transistor according to claim 1, wherein the plate is formed by an etch back process of polysilicon doped with $POCl_3$.

6. A trench DRAM cell with a vertical transistor according to claim 1, wherein the gate oxide is formed to a thickness of 100 Å to 800 Å.

7. A trench DRAM cell with a vertical transistor according to claim 1, wherein a bottom of the trench is formed by a p+ diffused layer in order to provide cell-to-cell isolation.

8. A trench DRAM cell with a vertical transistor according to claim 1, wherein the drain is formed by an n+ diffused layer implanted with As ions.

9. A trench DRAM cell according to claim 1, wherein the drain is formed on a surface of a silicon single crystal, and the silicon single crystal is grown on all the regions except for the trench region by SEG (Selective Epitaxial Growth) technology.

10. A trench DRAM cell according to claim 9, wherein the silicon single crystal is grown to a thickness of 1 μm.

* * * * *